United States Patent
Doris et al.

(10) Patent No.: US 7,105,391 B2
(45) Date of Patent: Sep. 12, 2006

(54) PLANAR PEDESTAL MULTI GATE DEVICE

(75) Inventors: Bruce B. Doris, Brewster, NY (US); John Charles Petrus, Stanfordville, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 10/708,451

(22) Filed: Mar. 4, 2004

(65) Prior Publication Data

US 2005/0196912 A1    Sep. 8, 2005

(51) Int. Cl.
*H01L 21/00*    (2006.01)
(52) U.S. Cl. .............. 438/151; 438/197; 438/299
(58) Field of Classification Search ............... 438/149, 438/151, 197, 299
See application file for complete search history.

(56) References Cited

U.S. PATENT DOCUMENTS

| | | | |
|---|---|---|---|
| 5,637,898 A | 6/1997 | Baliga | |
| 5,702,963 A * | 12/1997 | Vu et al. | 438/197 |
| 5,742,363 A | 4/1998 | Bae | |
| 6,096,590 A | 8/2000 | Chan et al. | |
| 6,177,708 B1 | 1/2001 | Kuang et al. | |
| 6,855,969 B1 * | 2/2005 | Inoh | 257/250 |
| 2002/0093053 A1 * | 7/2002 | Chan et al. | 257/347 |
| 2002/0177324 A1 | 11/2002 | Metzler | |
| 2002/0192911 A1 | 12/2002 | Parke | |
| 2005/0161711 A1 * | 7/2005 | Chu | 257/288 |

* cited by examiner

*Primary Examiner*—Tuan H. Nguyen
(74) *Attorney, Agent, or Firm*—Howard M. Cohn; H. Daniel Schnurmann

(57) ABSTRACT

A method of forming a transistor comprises disposing a planar platform (or pedestal, or layer) of silicon atop a support structure of oxide which is atop a substrate; forming gate structures both atop and beneath the planar platform; and forming source and drain diffusions within the planar platform. The gate structures which are formed beneath the planar platform may smaller than the planar platform, and may be aligned with the gate structures which are formed atop the planar platform. A transistor formed by the method is also disclosed.

17 Claims, 6 Drawing Sheets

PLANAR PEDESTAL MULTI GATE DEVICE

BACKGROUND OF INVENTION

The invention relates to semiconductors and, more particularly, to silicon-on-insulator (SOI) transistor devices.

Transistors typically consist of three basic elements: the source, the gate and the drain. Current flows from the source to the drain when the gate is charged. Bipolar and MOS (metal-oxide semiconductor) are two basic types of transistors. CMOS (complementary metal-oxide semiconductor) is an extension of MOS formed by joining two transistors and different dopants in the various regions. Because of the complementary behavior in CMOS, there is no current flow through the device except when it switches. CMOS circuits therefore consume less power when compared to Bipolar counterparts which leak current in their off state. MOS has become the mainstay of chip design.

Traditionally, transistors were fabricated on bulk silicon. More recently, they are being fabricated using silicon-on-insulator (SOI) technology. The difference between conventional MOS and Silicon-on-Insulator (SOI) construction is a layer of insulating material separating the transistor's silicon junction area and the bulk silicon.

Double-gate transistors will help improve processor speed and power use by allowing better control of electrical flow across the transistor. Simply stated, transistors react to electricity and go to either an on or off state, providing the binary status necessary for computer operations. But as chips continue to shrink, single-gate transistors will experience increased electron leakage (which can keep transistors trapped in the on state), higher energy needs, and worsened electrical flow.

U.S. Patent Application No. 2002/0192911 discloses Damascene double gated transistors and related manufacturing methods. This invention provides the structure and fabrication process of a completely planar, Damascene double gated transistor. The structure has a self-aligned, hyper-abrupt retrograde body and a zero-parasitic, end-wall gate-body connection. The structure provides for increased density and enables ultra low power to be utilized. The methods also provide for simultaneously making both four-terminal and dynamic threshold MOSFET devices.

SUMMARY OF INVENTION

According to the invention, a method of forming a transistor comprises: disposing a planar platform (or pedestal, or layer) of silicon atop a support structure of oxide which is atop a substrate; forming gate structures both atop and beneath the planar platform; and forming source and drain diffusions within the planar platform. The gate structures which are formed beneath the planar platform may smaller than the planar platform, and may be aligned with the gate structures which are formed atop the planar platform. A transistor formed by the method is also disclosed.

According to a feature of the invention, the back gate electrode has a length and width approximately equal to a length and width of the planar pedestal.

According to a feature of the invention, the back gate electrode wraps around side edges of the planar pedestal.

In an embodiment of the invention, the back gate electrode is smaller than the planar pedestal.

In an embodiment of the invention, there are two top gates; and the back gate electrode is aligned under the two top gates.

In an embodiment of the invention, there are two top gates; and inner edges of the top gates are aligned with outer edges of the standoff structure.

An advantage of the present invention over the prior art is that the planar pedestal multi-gate device can be scaled to smaller gate dimensions and thus provide more performance due to the multi-gate structure. The additional gate control is capable of terminating the drain fields thereby improving the short channel effect control.

BRIEF DESCRIPTION OF DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

DETAILED DESCRIPTION

Figure 1:
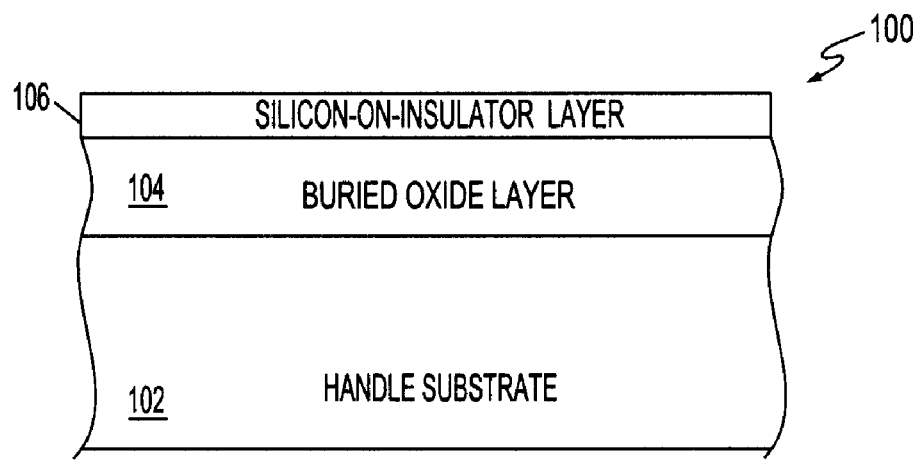
FIGS. 1–11 are cross-sectional views illustrating a sequence of steps (process flow) for a wafer being processed, according to the invention.

In the description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred simply as "oxide", chemical formula SiO2.

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, often both reference numerals and legends (labels, text descriptions) will be used to identify elements. If legends are provided, they are intended merely as an aid to the reader, and should not in any way be interpreted as limiting.

Figure 2:
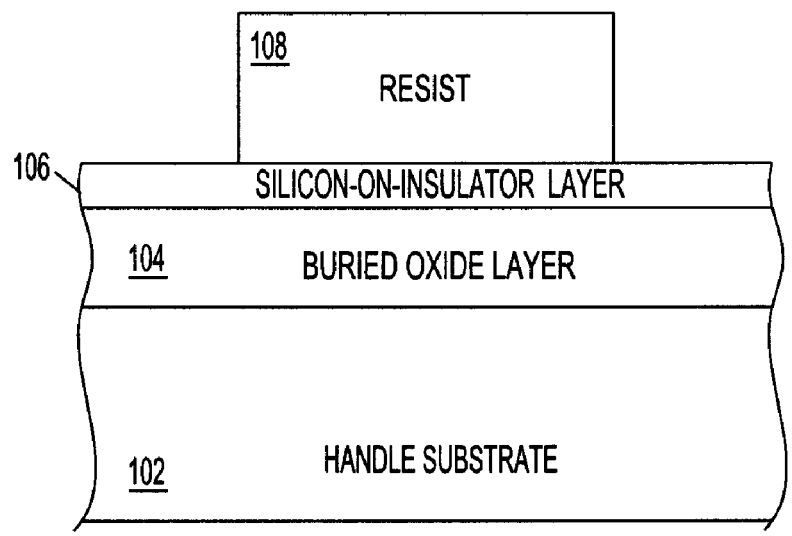

FIG. 1 shows a silicon-on-insulator (SOI) SOI wafer 100 comprising a handle substrate 102 which may be about, but is not limited to several hundred microns thick, a buried oxide (BOX) layer 104 of about 2 to about 2000 A (Angstroms, Å) thick, and a silicon-on-insulator (SOI) layer 106, which may range in thickness from about 5 nm (nanometers) to about 100 nm. (1 micron=1e-6 meter=1000 nm=10000 Å) A lithography procedure is used to create a patterned a resist image (mask) 108 over the silicon-on-insulator layer 106, as shown in FIG. 2 Alternatively, a hard-mask process (not shown) may be used. The hard-mask process comprises first depositing a hard mask material (dielectric film) such as silicon dioxide (SiO2), silicon nitride (SiNO3), or silicon oxynitride (SiOxNy). The dielectric film may be deposited by a process such as chemical vapor deposition (CVD), plasma enhanced chemical vapor deposition (PECVD) or rapid thermal chemical vapor deposition (RPCVD). A lithography process is then used to pattern the resist image over the silicon-on-insulator layer 106.

Figure 3:
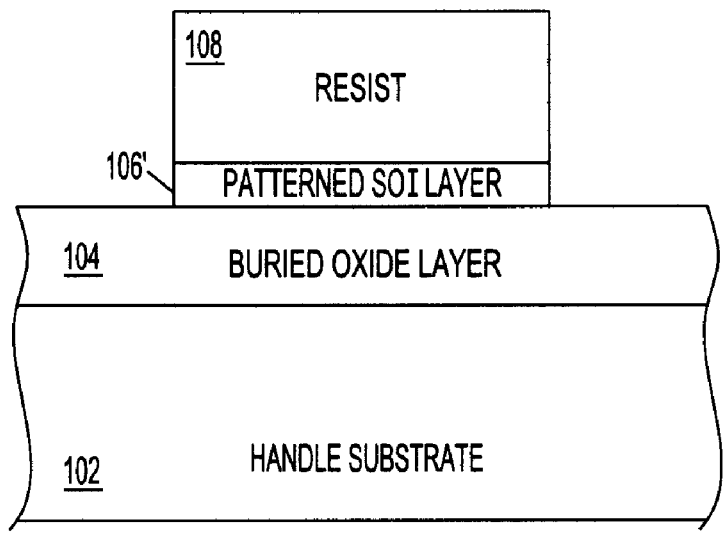

Next, a dry etch process which is selective to the resist (or, alternatively, to the hard mask material) and the buried oxide layer 104 is used to transfer the resist images into the silicon-on-insulator layer 106, as shown in FIG. 3. The patterned silicon (SOI) layer 106 is shown with a prime number, as 106'. This layer 106' will become the active silicon layer of a transistor being formed.

Figure 4:
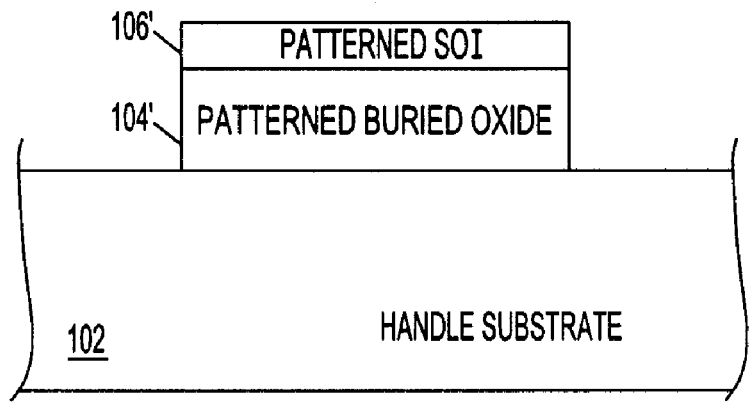

Next, the resist image 108 is removed using a wet solvent strip and/or a dry oxygen plasma ashing process. Another dry, anisotropic etch process capable of etching SiO2 selectively with respect to the patterned silicon layer 106' is used to etch the buried oxide layer 104 from the regions outside the patterned silicon layer 106', as shown in FIG. 4. The patterned buried oxide layer 104 is shown with a prime number, as 104'. This etch exposes a portion of the top surface of the handle substrate 102.

At this stage of the process, the buried oxide 104' is aligned with the patterned silicon layer 106'. The patterned silicon layer 106' will become the active silicon layer. The patterned silicon layer 106' is generally rectangular (in plan view) having a length dimension (L; left-to-right, as viewed; perpendicular to the gate electrodes described hereinbelow) of about 0.1 microns to about 10 microns, and a width dimension (W; into the page, as viewed; parallel to the gate electrodes) of about 0.05 microns to 10 microns, and the aforementioned thickness of 5–100 nm.

Figure 5:
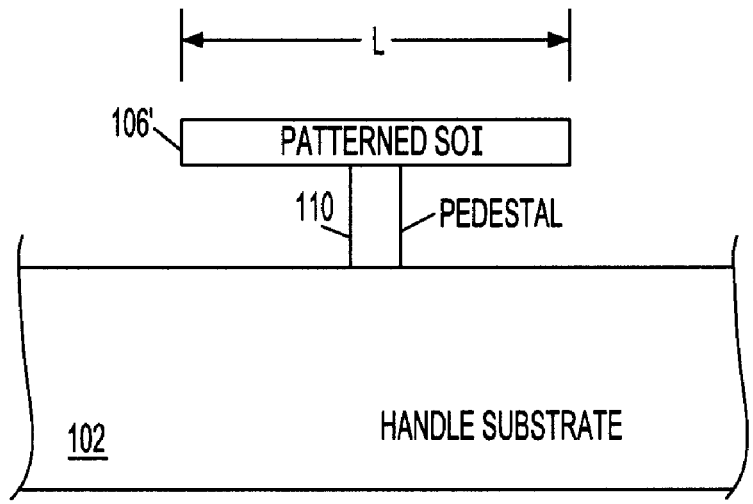

Next, an isotropic dry or wet etch process is used to remove a portion, but not all, of the buried oxide layer 104' from under the patterned silicon layer 106' to form a standoff structure 110 as shown in FIG. 5. The wet etch process may consist of a hydrofluoric acid and water mixture. The standoff structure 110 is a portion of patterned buried oxide (BOX) layer 104'. The standoff structure 110 is centered under the patterned silicon layer 106'. This "back etch" exposes a substantial (e.g., approximately 80%) portion of the underside of the patterned silicon layer 106', and a further portion of the top surface of the handle substrate 102. Suitable dimensions for the stand-off structure 110 are 10–100 nm wide (left-to-right, as viewed) and approximately 200 nm high.

In FIG. 5 it can be observed that the patterned SOI layer 106' is a substantially planar element (hereinafter "pedestal", or platform) supported from beneath by (disposed atop) the standoff structure 110. An important feature of the invention, that the SOI pedestal 106', upon which the transistor will be built, is remote from the bulk silicon of the handle substrate 102. As will become evident, in this manner, multiple gate structures can be formed on the silicon pedestal.

After a sacrificial oxidation process, which can be performed by a dry or wet thermal oxidation process, a pregate oxide cleaning procedure which includes but is not limited to standard oxide removal, organic and metallic cleaning processes and final hydrogen termination is used to prepare the exposed surfaces of the patterned silicon layer 106' for gate oxidation. During this step, the exposed surface of the handle substrate 102 is also prepared for gate oxidation.

Figure 6:
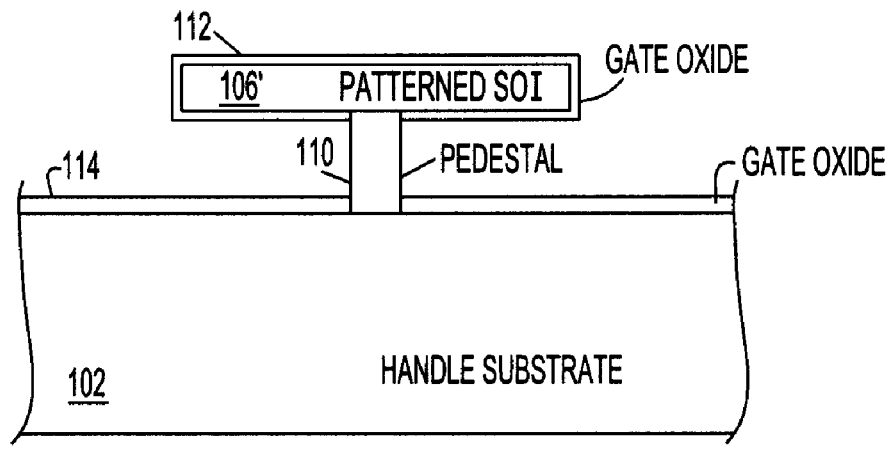

Next, gate oxidation is performed. The gate oxidation may comprise a thermal oxidation process and subsequent nitridation process and may also be followed by deposition of a high-k gate dielectric such as hafnium oxide. Gate oxide 112 is formed on the exposed surfaces of the planar pedestal 106' (everywhere except where the standoff structure 110 is "attached", underneath the pedestal). Gate oxide 114 is also formed on the exposed (upper) surface of the handle substrate 102. The resulting gate-oxidized structures are illustrated in FIG. 6. The gate oxide is typically silicon dioxide (SiO2), and suitably has a thickness of approximately 10–12 Angstroms.

The gate oxide 112 on the planar pedestal 106' will serve the usual function of gate oxide. A useful structural element of this invention is that gate dielectric (oxide) 114 is also formed on the handle substrate (wafer) 102. This layder 114 will be used not for the usual function of gate oxide, but rather as an etch stop in a gate stack etch process at a further point in the process flow.

Next, a gate electrode material 120 such as polysilicon (poly-Si, poly) is deposited, atop the handle substrate 102, and covering (surrounding) the standoff structure 110 as well as planar pedestal 106'. The gate electrode material 120 suitably has a thickness of approximately 750–2000 Angstroms. The gate electrode material 120 be a stack of materials which extends approximately 500–1500 Angstroms above the top surface of the patterned SOI layer 106'.

Figure 7:
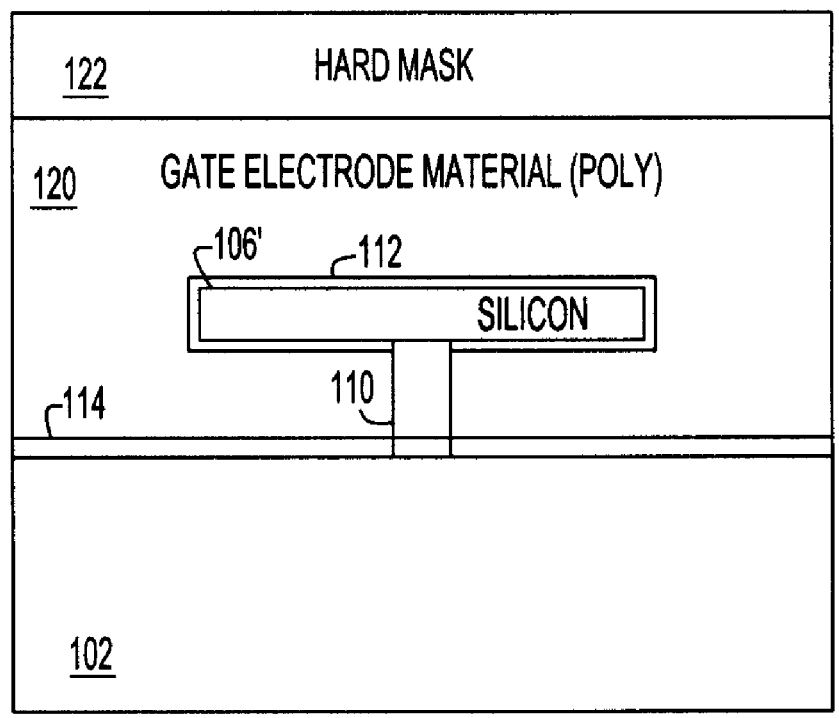

A hard mask material 122 such as SiO2 is deposited directly on top of the gate electrode material 120. The resulting structure is illustrated in FIG. 7. Alternatively, a metal film like tungsten or titanium nitride may be deposited.

In FIG. 7 it can be observed that by using a standoff structure 110, the polysilicon 120 can be formed to completely surround the channel (planar pedestal 106"). As will become evident, an advantage of the present invention over the prior art is that the planar pedestal multi-gate device can be scaled to smaller gate dimensions and thus provide more performance due to the multi-gate structure (described hereinbelow). The additional gate control is capable of terminating the drain fields thereby improving the short channel effect control.

Figure 8:
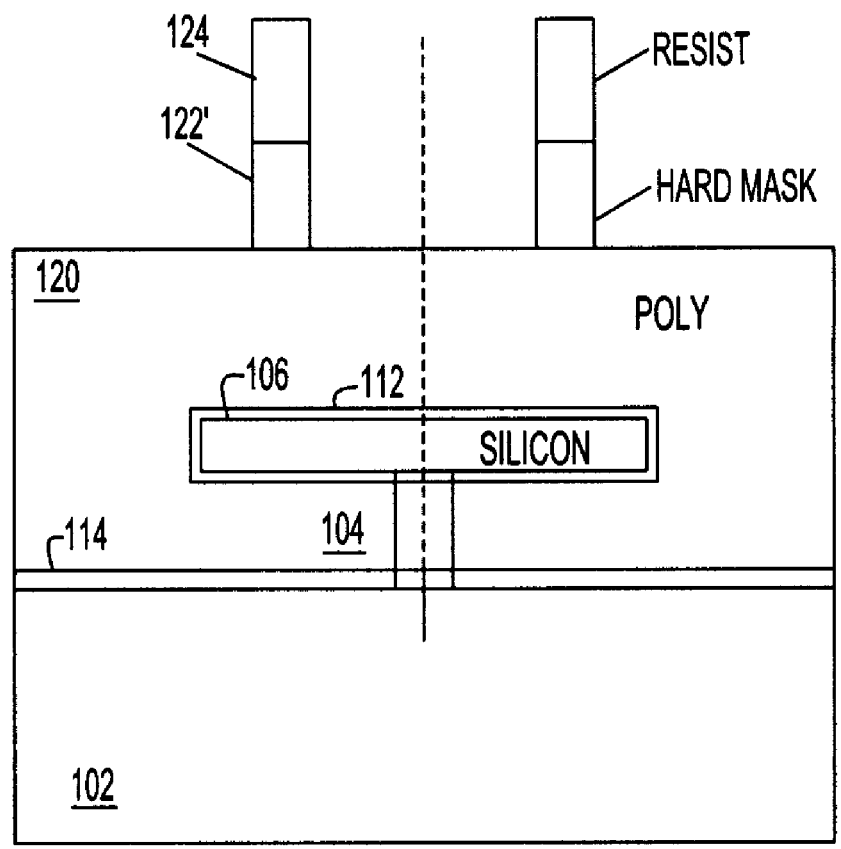

The gate electrode material 120 is patterned by first using a conventional lithography process to create resist images 124. The resist images are transferred to the hard mask 122 by a dry plasma etch process, as shown in FIG. 8. The patterned (imaged) hard mask layer 122 is shown with a prime number, as 122'.

After the hard-mask 122' is defined, the resist images are removed using an oxygen (O2) ashing process. Next, a two step etch process is used to pattern a gate stack.

The first step is an anisotropic dry etch that is selective to the gate dielectric 112 (also 114, but 114 is covered by poly), and is used to define the top portion of a gate stack electrode 130.

In this step, the gate electrode material 120 is etched down to approximately the level of the top surface of the planar pedestal 106', other than underneath the hard mask 122'. This creates electrode structures 130 atop the planar pedestal 106' and isolated therefrom by gate oxide 112. The electrode structures 130 suitably have a width of 5–50 nm and a height of 50–150 nm. The remaining gate electrode material 120, below the top surface of the SOI layer 106' is shown with a prime number, as 120'. The gate electrodes 130 have a greater width than the planar pedestal 106".

After the first part of the etch, sidewall spacers 132 may (optionally) be formed on the gate stack electrodes 130 using a conventional conformal deposition of oxide (SiO2) or nitride (SiN) and using a directional dry etch process. The resulting structure is shown in FIG. 9.

Figure 9:
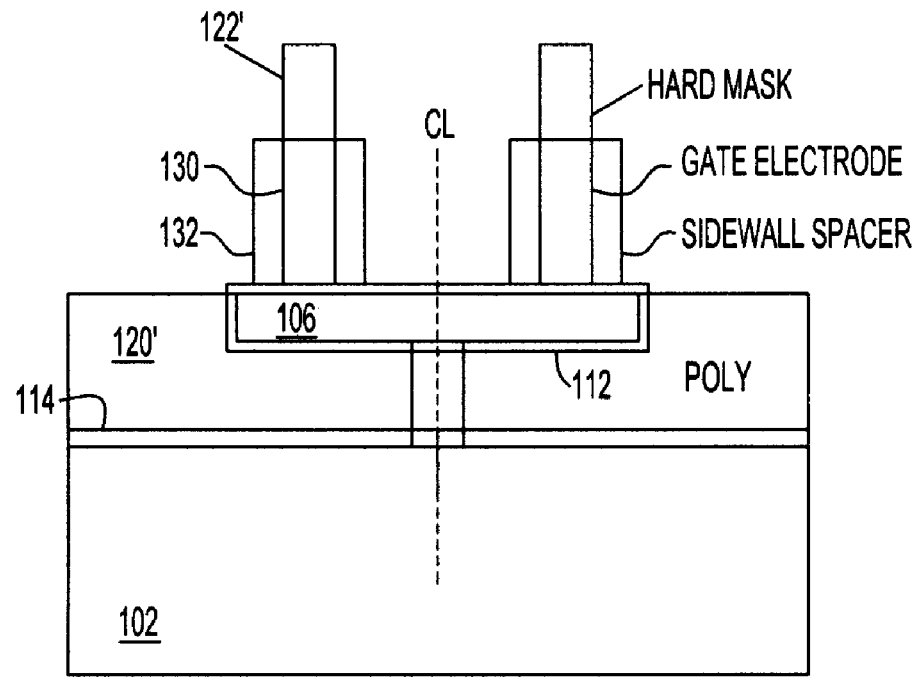

FIG. 9 shows that two gate electrodes 130 can simultaneously be formed atop a single SOI layer 106'. The gate electrodes 130 are shown as being symmetrically disposed on the planar pedestal 106", on either side of a centerline CL. Also, the standoff structure 110 is shown as being centered under the planar pedestal 106'. It should be understood that this example is illustrative, and should not be interpreted as limiting. For example, the standoff structure 110 could be off-center. More than two gate electrodes or a single gate electrode could be formed atop the single SOI layer 106'.

The second part of the gate stack etch is an anisotropic etch which removes at least the remaining, bottom portion of the gate electrode material 120' from areas outside the planar pedestal 106".

Figure 10A:
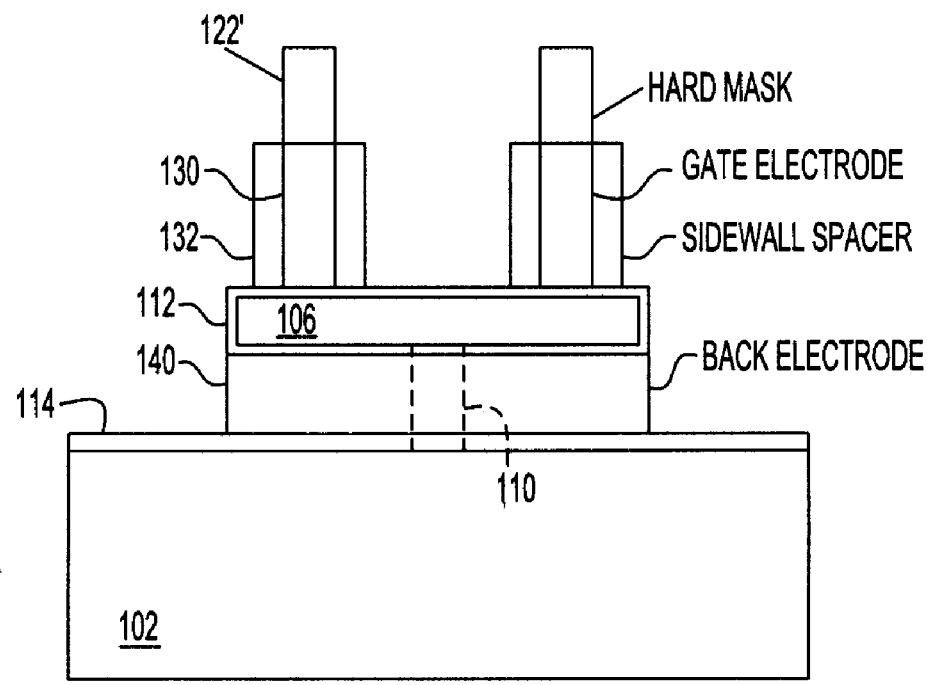

In one embodiment, a large bottom (back) gate electrode 140 is formed which can be approximately the size (length and width) of the planar pedestal 106". The gate electrode 140 under the planar pedestal (active Si area) 106' acts as a back gate to form a ground plane device. The back gate electrode wraps around the side edges of the active Si region 106'. This is shown in FIG. 10A.

Figure 10B:
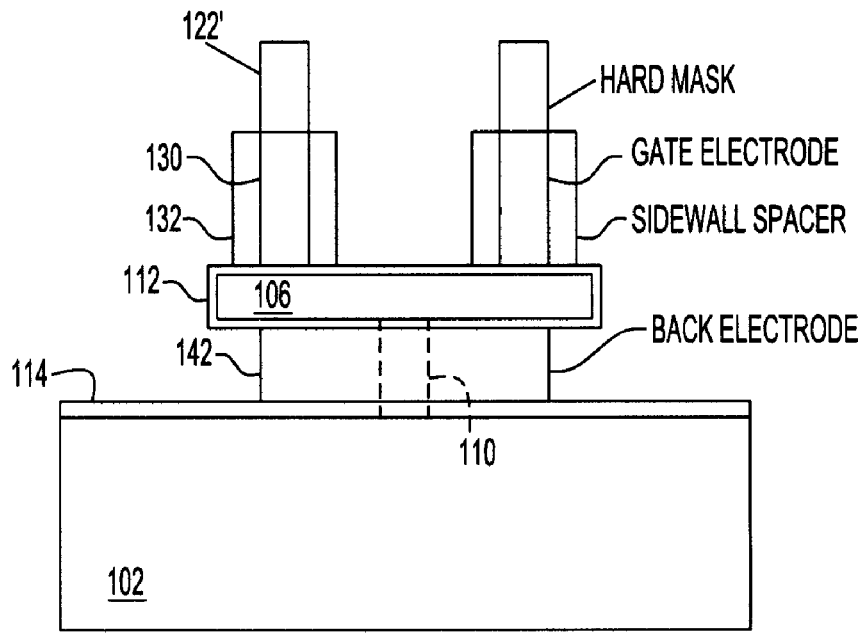

Etching can proceed further, making the back gate 140 smaller than the planar pedestal 106". For example, the back gate 140 which is formed under (beneath) the planar pedestal (or platform) can be further etched so that it is aligned under the two top gate electrodes 130 which are formed atop the planar platform. This is shown in FIG. 10B. The back electrode is labeled 142 in this figure.

Figure 10C:
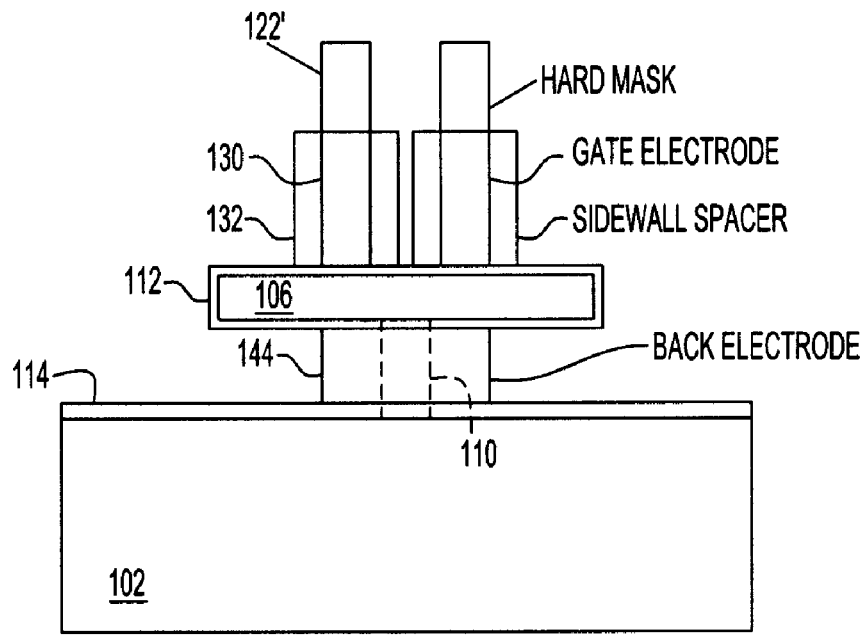

The top gates 130 can be located further in towards the centerline, so that their inner edges are aligned with the outer edges of the standoff structure 110. And the back gate 142 can further be etched so that its outer edge is aligned with the outer edges of the top gate electrodes 130. This is shown in FIG. 10C. The back electrode is labeled 144 in this figure.

In general, the bottom gate is fabricated by the two step etch process. The first etch etches material away from the areas under the resist. The etch stops at the active Si region. Then spacers are formed. After the spacer, another etch is done to the bottom of the BOX. At this stage, there is gate material under the resist as well as under the active Si region. If the Si region is sufficiently narrow, then a non-directional etch can be used to remove gate material under the Si region so that the "top gate" and the "bottom gate" are self-aligned.

A feature of the invention is that the active Si region can be smaller (in the parallel to gate electrode direction) than the combination of the top gate and spacer dimension. This aspect allows an isotropic etch to clear away gate electrode material away from the underside of the active area except for the region under the top gate. In this way, the top electrode is self-aligned to the bottom electrode.

It is generally preferred that the Si active region 106' is more narrow than the gate 130 and spacer structure 132 so that the gate electrode material 120' can be removed from the majority of the bottom portion of the active region by a dry, isotropic etch to form a self-aligned multi-gate device. The top and bottom gates extend both extend widthwise (into the page, as shown) further than the planar pedestal.

Figure 11:
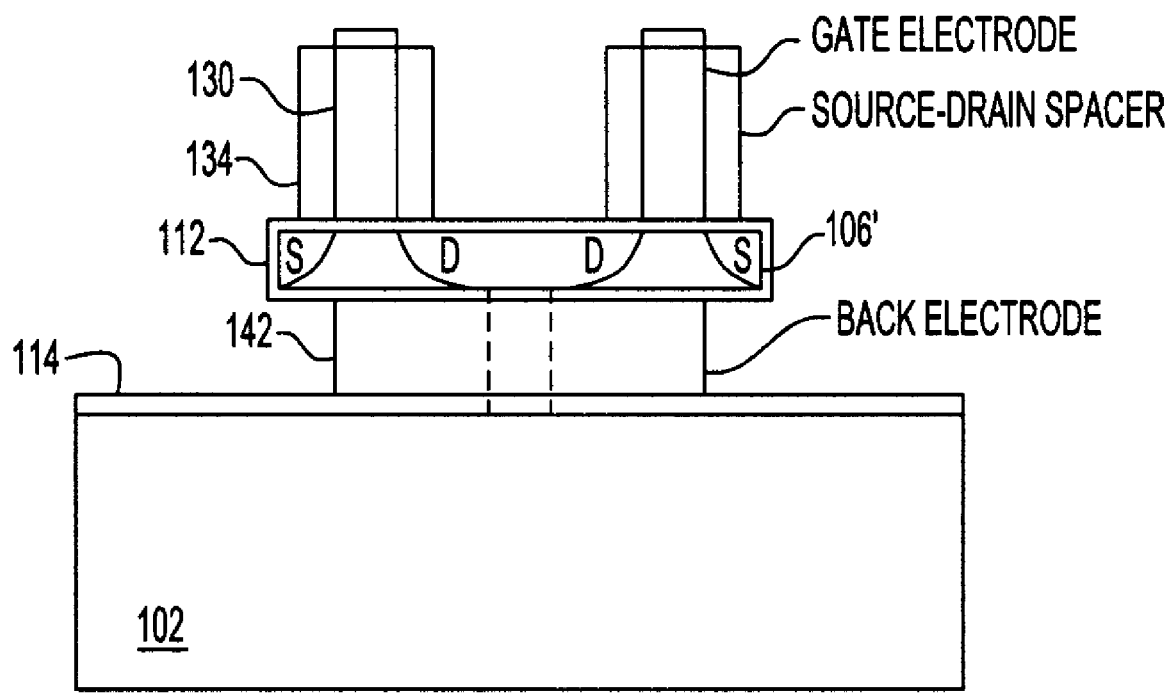

Next, the sidewall spacers 132 are removed using a wet or dry process. (The hard mask 122' is also removed.) Next if needed, halos (not shown) are formed by ion implantation for nFETs and pFETs using boron and arsenic respectively for example. Extensions (not shown) may next be formed by ion implantation using p and n-type dopants for pFETs and nFETs, respectively. A source-drain spacer 134 is next formed by deposition and anisotropic etching as shown in FIG. 11. The gate electrode 130 extends at least as high as the source-drain spacer 134. Source (S) and Drain (D) junctions are formed by ion implantation and activation anneal. Representative source (S) and drain (D) implants are illustrated. Selective epitaxial Si may be used to form raised source drain regions if the Si pedestal is thinner than about 500 A. Silicide and conventional back-end-of line processing completes the flow. An example of a final transistor device structure is shown in FIG. 11, which is based on the structure shown in FIG. 10B. An advantage of this invention is that instead of the gate (130) controlling the channel from only one side, the gate (top gate 130, plus bottom gate 140, 142 or 144) completely surrounds the Si channel 106" from all sides. This results in significantly improved short channel effect control. The Si pedestal structure 106' ideally is about the same height and width or smaller than the gate dimension.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

The invention claimed is:

1. Method of forming a transistor comprising:
    disposing a planar platform of silicon atop a support structure of oxide which is atop a substrate;
    wherein the support structure is disposed beneath the planar platform;
    forming multiple gate structures both atop and beneath the planar platform; and
    forming source and drain diffusions within the planar platform.

2. Method, according to claim 1, wherein:
    the gate structures which are formed beneath the planar platform are smaller than the planar platform.

3. Method, according to claim 1, wherein:
    the gate structures which are formed beneath the planar platform are aligned with the gate structures which are formed atop the planar platform.

4. Method, according to claim 1, wherein:
    the platform of silicon is supported from below by the support structure.

5. Method, according to claim 1, wherein:
    the support structure is centered under the planar platform of silicon.

6. Method, according to claim 1, wherein:
    the support structure is 10–100 nm wide and approximately 200 nm high.

7. Method, according to claim 1, wherein:
    the support structure is in contact with the underside of the planar platform, leaving approximately 80% of an underside of the planar platform is exposed.

8. Method of forming a transistor comprising:
providing an SOI wafer comprising a handle substrate, a buried oxide layer (BOX) disposed atop the handle substrate and a silicon-on-insulator (SOI) layer disposed atop the buried oxide layer;
in a first etching step, patterning the SOI layer to become the active silicon layer of an SOI transistor, wherein a portion of the buried oxide layer is underneath the patterned SOI layer and other portions of the buried oxide layer are not underneath the patterned SOI layer, and wherein a top surface of the patterned SOI layer is exposed;
in a second etching step, etching the portions of the buried oxide layer which are not underneath the patterned SOI layer, thereby exposing a portion of a top surface of the handle substrate;
in a third etching step, removing the buried oxide layer from under the patterned SOI layer to form a standoff structure, thereby exposing a portion of a bottom surface of the patterned SOI layer,
performing gate oxidation, thereby forming gate oxide on the exposed surfaces of the patterned SOI layer;
depositing gate electrode material atop the handle substrate and covering the standoff structure as well as the patterned SOI layer; and
in a fourth etching step, etching the gate electrode material to form at least one gate stack atop the patterned SOI layer.

9. Method, according to claim 8, further comprising:
in a fifth etching step, etching the gate electrode material to form a back gate beneath the patterned SOI layer.

10. Method, according to claim 8, wherein:
the back gate is aligned with the at least one gate stack.

11. Method, according to claim 8, wherein:
the third etching step exposes a substantial portion of the underside of the patterned SOI layer.

12. Method, according to claim 8, wherein:
the third etching step exposes approximately 80% of the underside of the patterned SOI layer.

13. Method, according to claim 8, wherein:
the third etching step exposes additional portions of the handle substrate.

14. Method, according to claim 8, wherein:
during gate oxidation, gate oxide is also formed on the exposed surface of the handle substrate.

15. Method, according to claim 8, further comprising:
prior to the fourth etching step, depositing a hard mask material on top of the gate electrode material;
defining the hard mask material;
then performing the fourth etching step;
then removing the hard mask.

16. Method, according to claim 8, wherein:
the gate stack is etched in the fourth etching step using an anisotropic dry etch that is selective to the gate oxide.

17. Method, according to claim 8, wherein:
in the fourth etching step, the gate electrode material is etched down to approximately the level of the top surface of the patterned SOI layer, thereby creating electrode structures atop the patterned SOI layer and isolated therefrom by gate oxide.

* * * * *